US007004646B2

United States Patent
Ichihara et al.

(10) Patent No.: US 7,004,646 B2
(45) Date of Patent: Feb. 28, 2006

(54) RECEPTACLE TYPE OPTICAL TRANSMITTER AND/OR RECEIVER MODULE

(75) Inventors: Yasuhiro Ichihara, Kawasaki (JP); Yasuhide Kuroda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 10/688,967

(22) Filed: Oct. 21, 2003

(65) Prior Publication Data
US 2004/0081468 A1  Apr. 29, 2004

(30) Foreign Application Priority Data
Oct. 28, 2002  (JP) .............. 2002-312080

(51) Int. Cl.
*G02B 6/36* (2006.01)
*H04B 10/00* (2006.01)

(52) U.S. Cl. .............. 385/92; 385/88; 385/139; 398/139

(58) Field of Classification Search .......... 385/88, 385/89, 92, 93, 94, 139, 14; 398/117, 130, 398/131, 138, 139
See application file for complete search history.

(56) References Cited

U.S. PATENT DOCUMENTS

| 5,295,214 | A | * | 3/1994 | Card et al. ............... 385/92 |
| 5,604,831 | A | * | 2/1997 | Dittman et al. ........... 385/88 |
| 5,767,999 | A | * | 6/1998 | Kayner .................... 398/164 |
| 6,164,838 | A | * | 12/2000 | Maehara et al. ........... 385/92 |
| 6,445,475 | B1 | * | 9/2002 | Okubora et al. ........... 398/141 |
| 2003/0142929 | A1 | * | 7/2003 | Bartur et al. ............ 385/92 |

FOREIGN PATENT DOCUMENTS

| JP | 07-010705 | 2/1995 | ............ 385/14 X |
| JP | 2000-183370 | 6/2000 | ............ 385/88 X |
| JP | 2001-091795 | 4/2001 | ............ 385/14 X |
| JP | 2001-350060 | 12/2001 | ............ 385/14 X |

* cited by examiner

Primary Examiner—Brian M. Healy
(74) Attorney, Agent, or Firm—Staas & Halsey LLP

(57) ABSTRACT

A receptacle type opto-electrical module including a printed wiring board having a first segment, a second segment arranged substantially perpendicularly to the first segment, and a flexible portion for connecting the first segment and the second segment. The opto-electrical module further includes a first electric circuit component mounted on the first segment, a second electric circuit component mounted on a first surface of the second segment, a socket mounted on a second surface of the second segment opposite to the first surface, and an optical module detachably mounted to the socket.

15 Claims, 14 Drawing Sheets

11B

RECEPTACLE TYPE OPTICAL TRANSMITTER AND/OR RECEIVER MODULE

BACKGROUND OF THE INVENTION

1. Field of the Invention

The present invention relates to a receptacle type optical transmitter and/or receiver module.

2. Description of the Related Art

In an optical communication system using an optical fiber as a transmission line, a laser diode module (LD module) is used to introduce light emitted from a light emitting component (e.g., laser diode) into the optical fiber. In the LD module, the light emitting component and the incident end face of the optical fiber are fixed in a given positional relationship, and a condenser lens is interposed between the light emitting component and the incident end face of the optical fiber. Further, a photodiode module (PD module) is used to couple signal light emerged from an optical fiber to a photodetecting component (e.g., photodiode). In the PD module, the emergent end face of the optical fiber and the photodetecting component are fixed in a given positional relationship, and a condenser lens is interposed between the emergent end face of the optical fiber and the photodetecting component.

The primary type of such an LD module and a PD module as key devices in optical communication was a pigtail type such that an optical component and an optical fiber are integrated. However, a receptacle type optical module allowing separation of the optical component and the optical fiber is now desired because a mounting space for an optical module is reduced with a reduction in device size and an extra fiber length is accordingly difficult to settle. In mounting an optical module such as an LD module on a printed wiring board by soldering like a surface mount type component or a through hole mount type component, a so-called pigtail type optical module with an optical fiber cord is not suitable as the optical module.

That is, the optical fiber cord usually has a nylon coating, and the nylon coating has a low resistance to heat at about 80° C., so that it is melted in the soldering step. Furthermore, the optical fiber cord itself invites inconveniences in accommodation and handling at a manufacturing location, causing a remarkable reduction in mounting efficiency to the printed wiring board. Accordingly, to allow a soldering process for the optical module and reduce a manufacturing cost, the provision of a so-called receptacle type optical module is indispensable. There has been developed a receptacle type optical transmitter or receiver module for transmitting or receiving an optical signal wherein an optical component and electric circuit components are sealed together with resin by utilizing the merits of the receptacle type as mentioned above.

A conventional receptacle type optical transmitter module is composed of a receptacle type LD module, a printed wiring board on which a driver LSI for driving the LD module is mounted, and a lead frame functioning as an interface between the printed wiring board and a mother board. The LD module and the printed wiring board having the driver LSI are electrically connected by connecting lead terminals of the LD module and conductor patterns formed on the printed wiring board through conductive adhesive or wire bonding, for example. The assembly of the LD module and the printed wiring board is then sealed with a mold resin to thereby configure the optical transmitter module.

A process of assembling an opto-electrical integrated module for transmitting an optical signal is generally composed of the following three steps. (1) The first step is lead forming of an LD module. (2) The second step is fixedly mounting the LD module with the formed leads on a printed wiring board. (3) The final step is sealing the LD module and the printed wiring board with resin, thus completing the opto-electrical integrated module. The purpose of lead forming of the LD module is to make the leads of a general CAN type coaxial device match with the pattern pitch of the printed wiring board and to relax the application of stress to a bonding portion and root portion of each lead in bonding the LD module to the printed wiring board.

The conventional receptacle type optical transmitter or receiver module has the following problems.

(1) It is essential that an optical transmitter or receiver module can be mounted on a mother board by reflow soldering, so as to utilize the merit of its small size. However, a general LD module does not have heat resistance (240° C.) in reflow soldering, so that the LD module is mounted on the printed wiring board after reflow soldering. Further, another LD module having heat resistance is special in structure and therefore expensive.

(2) In connecting the optical module such as an LD module to the printed wiring board, lead forming of the optical module is required in order to make the leads match with the pattern pitch of the printed wiring board and to relax the stress applied to the bonding portion and root portion (glass sealed portion) of each lead. As a result, the connection distance between the optical module and the printed wiring board becomes long, causing a difficulty of high-speed operation.

(3) In the case that only the optical module malfunctions, it is impossible to replace or repair only the optical module in the condition that the electric circuit assembly having no problems is left. Further, also in the case that only the electric circuit assembly malfunctions, a similar problem arises.

SUMMARY OF THE INVENTION

It is therefore an object of the present invention to provide a receptacle type optical transmitter and/or receiver module wherein an optical module can be simply removed from a printed wiring board on which electric circuit components are mounted.

It is another object of the present invention to provide a receptacle type optical transmitter and/or receiver module wherein only a malfunctioning device can be replaced.

In accordance with an aspect of the present invention, there is provided a receptacle type optical transmitter and/or receiver module including a printed wiring board having a first segment, a second segment, and a flexible portion for connecting the first segment and the second segment; a first electric circuit component mounted on the first segment; a second electric circuit component mounted on the second segment; a socket mounted on the second segment; and an optical module detachably mounted to the socket.

Preferably, the receptacle type optical transmitter and/or receiver module further includes a lead frame on which the first segment of the printed wiring board is mounted and a resin for sealing the printed wiring board, a part of the lead frame, and the socket except a portion for receiving the optical module. Preferably, the optical module has a metal stem, and the metal stem is in contact with the lead frame, whereby an electromagnetic shielding effect can be obtained at the same time the optical module is plug-in connected to the socket. Preferably, the second segment is arranged substantially perpendicularly to the first segment and has first and second surfaces opposite to each other, wherein the second electric circuit component is mounted on the first surface of the second segment, and the socket is mounted on the second surface of the second segment.

In accordance with another aspect of the present invention, there is provided a receptacle type optical transmitter and/or receiver module including a first printed wiring board; a second printed wiring board arranged at a predetermined angle with respect to the first printed wiring board; a flexible printed wiring board for connecting the first printed wiring board and the second printed wiring board; a first electric circuit component mounted on the first printed wiring board; a second electric circuit component mounted on the second printed wiring board; a socket mounted on the second printed wiring board; and an optical module detachably mounted to the socket.

In accordance with a further aspect of the present invention, there is provided a receptacle type optical transmitter and/or receiver module including a first printed wiring board; a first socket mounted on the first printed wiring board; a second printed wiring board detachably mounted to the first socket; a first electric circuit component mounted on the first printed wiring board; a second electric circuit component mounted on the second printed wiring board; a second socket mounted on the second printed wiring board; and an optical module detachably mounted to the second socket.

In accordance with a still further aspect of the present invention, there is provided a receptacle type module for mounting an optical module, including a first printed wiring board; a second printed wiring board; a flexible printed wiring board for connecting the first printed wiring board and the second printed wiring board; a first electric circuit component mounted on the first printed wiring board; a second electric circuit component mounted on the second printed wiring board; and a socket mounted on the second printed wiring board for detachably mounting the optical module.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
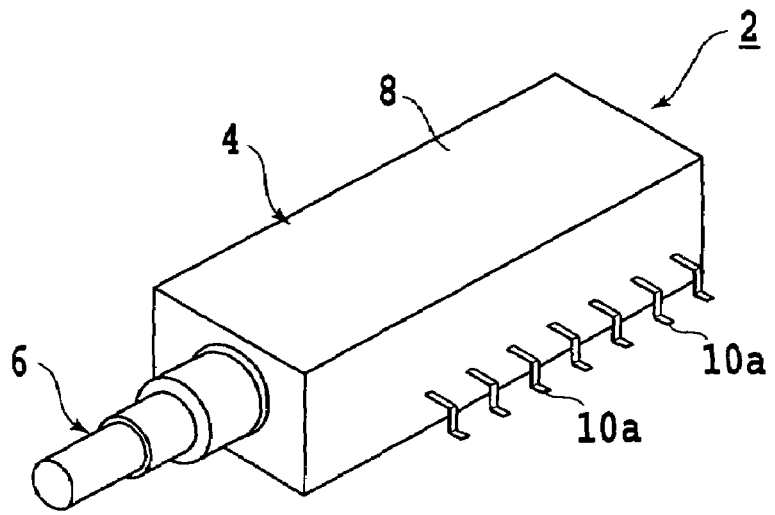
FIG. 1A is a perspective view of a first preferred embodiment of the present invention.
Figure 1B:
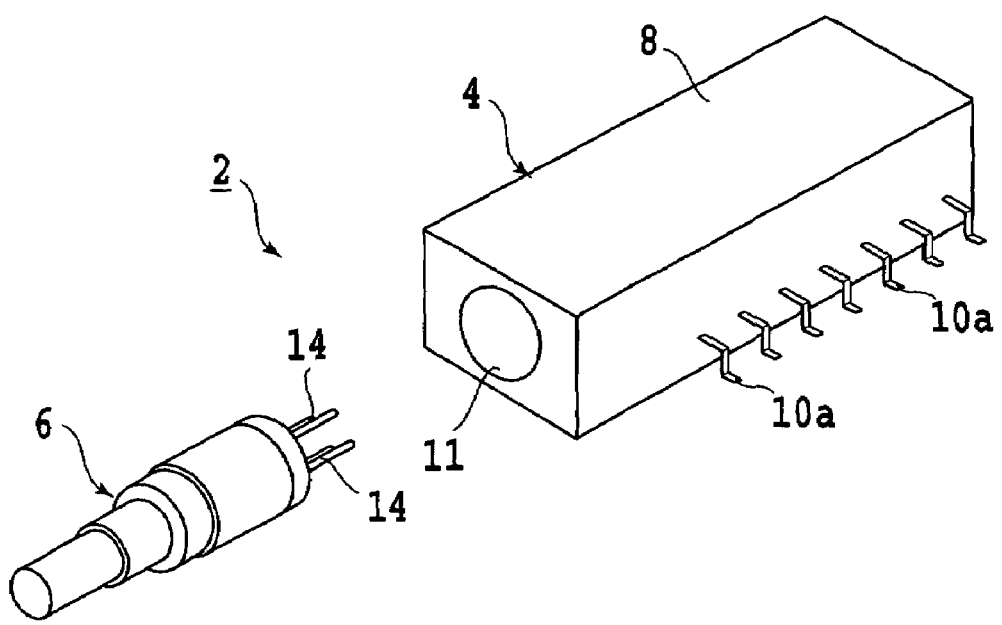
FIG. 1B is an exploded perspective view of the first preferred embodiment.

FIG. 1A is a perspective view of a receptacle type optical transmitter module 2 according to a first preferred embodiment of the present invention, and FIG. 1B is an exploded perspective view of the receptacle type optical transmitter module 2 in the condition that a laser diode module (LD module) 6 is removed from an electric circuit assembly 4. The receptacle type optical transmitter module 2 is configured by detachably mounting the LD module 6 to a receptacle portion 11 of the electric circuit assembly 4. The receptacle type optical transmitter module 2 includes a mold resin 8 for sealing. Reference numerals 10a denote a plurality of lead terminals of a lead frame 10 to be hereinafter described.

Figure 2A:
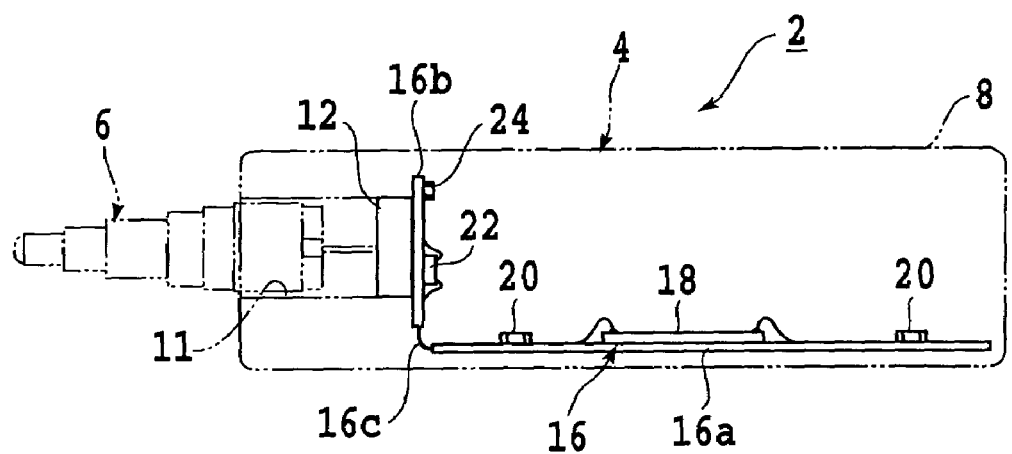
FIG. 2A is an elevational view showing an internal configuration of an electric circuit assembly in the first preferred embodiment.
Figure 2B:
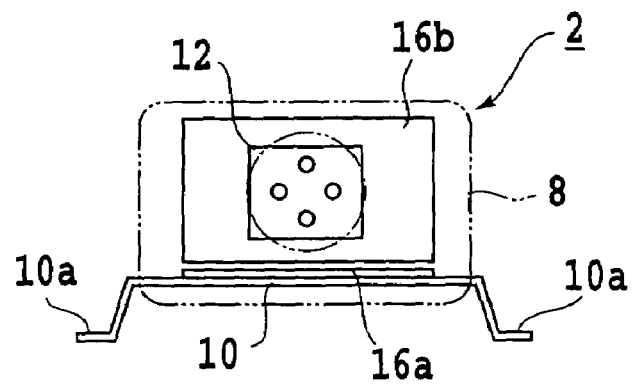
FIG. 2B is a left side view of FIG. 2A in the condition where a lead frame is added.
Figure 3:
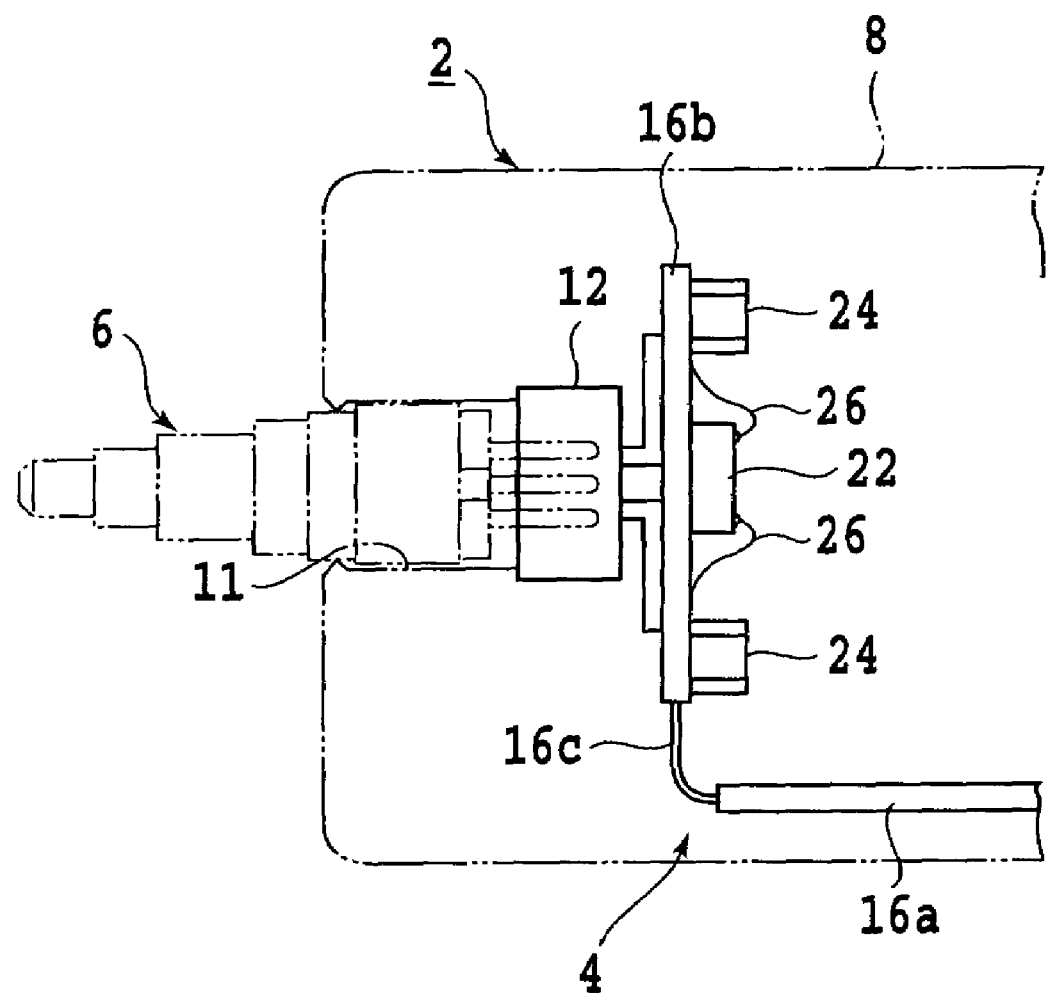
FIG. 3 is a partially cutaway, enlarged view of FIG. 2A.

FIG. 2A is an elevational view showing an internal structure of the electric circuit assembly 4, and FIG. 2B is a left side view of FIG. 2A. In FIG. 2B, however, the lead frame 10 is additionally shown. FIG. 3 is a partially cutaway, enlarged view of the electric circuit assembly 4. Referring to FIG. 2A, a printed wiring board 16 is included in the electric circuit assembly 4. The printed wiring board 16 has a first segment 16a mounted on the lead frame 10, a second segment 16b arranged substantially perpendicularly to the first segment 16a, and a flexible portion 16c for connecting the first segment 16a and the second segment 16b. The flexible portion 16c is a very thin portion formed from the printed wiring board 16, and a conductor pattern is formed on only a surface layer of the flexible portion 16c. This conductor pattern electrically connects an electric circuit in the first segment 16a and an electric circuit in the second segment 16b. Each of the first and second segments 16a and 16b has a surface layer pattern and a plurality of inner layer patterns.

While this preferred embodiment employs the single printed wiring board 16 consisting of the first segment 16a, the second segment 16b, and the flexible portion 16c, a plurality of separate printed wiring boards corresponding to these portions 16a, 16b, and 16c may be used instead. More specifically, the optical transmitter or receiver module according to the present invention may include a first printed wiring board, a second printed wiring board arranged substantially perpendicularly to the first printed wiring board, and a flexible printed wiring board (FPC) for connecting the first printed wiring board and the second printed wiring board.

An LSI 18 and surface mount devices (SMDs) 20 such as a resistor and a capacitor are mounted on the first segment 16a of the printed wiring board 16. The LSI 18 and the SMDs 20 constitute a first electric circuit component. In this preferred embodiment wherein the LD module 6 is mounted to the electric circuit assembly 4, the LSI 18 is a control LSI for performing communication control between the receptacle type optical transmitter module 2 and a mother board for mounting the module 2 thereon, for example.

As best shown in FIG. 3, a driver LSI 22 for driving the LD module 6 and SMDs 24 such as a resistor and a capacitor are mounted on a first surface of the second segment 16b of the printed wiring board 16. The driver LSI 22 and the SMDs 24 constitute a second electric circuit component. The driver LSI 22 and the SMDs 24 are connected by bonding wires 26. An SMD type socket 12 is mounted on a second surface of the second segment 16b opposite to the first surface on which the driver LSI 22 and the SMDs 24 are mounted. In this preferred embodiment, the LSIs 18 and 22, the SMDs 20 and 24, and the SMD type socket 12 can be simultaneously soldered to the printed wiring board 16 by reflow soldering. After performing this reflow soldering, the printed wiring board 16, a part of the lead frame 10, and the socket 12 except a portion for receiving the LD module 6 are sealed with the mold resin 8. At this time, the receptacle portion 11 is formed. The printed wiring board 16 is sealed with the mold resin 8 so that the second segment 16b is arranged substantially perpendicularly to the first segment 16a.

In the prior art optical transmitter module previously mentioned, the leads of the LD module are formed and thereafter connected to the printed wiring board. Accordingly, each lead of the LD module is required to have a length of about 10 mm, resulting in an increased distance from the LD module to the driver LSI mounted on the printed wiring board, so that a high-speed operation is difficult. This is due to the fact that an increase in lead length causes an increase in L component (inductance) of each lead, resulting in resonance at a connecting portion of each lead. The lead length that can support a high-speed operation must be suppressed to 3.5 mm or less for 600 Mb/s or 1.5 mm or less for 2.4 Gb/s. In this preferred embodiment, the driver LSI 22 is mounted on the first surface of the second segment 16b, and the SMD type socket 12 is mounted on the second surface of the second segment 16b opposite to the first surface. That is, the socket 12 is opposed to the driver LSI 22 through the second segment 16b. Further, the LD module 6 is plug-in connected to the socket 12. Accordingly, the length of each lead 14 (see FIG. 1B) can be greatly reduced to thereby realize a high-speed receptacle type opto-electrical module.

Figure 4:
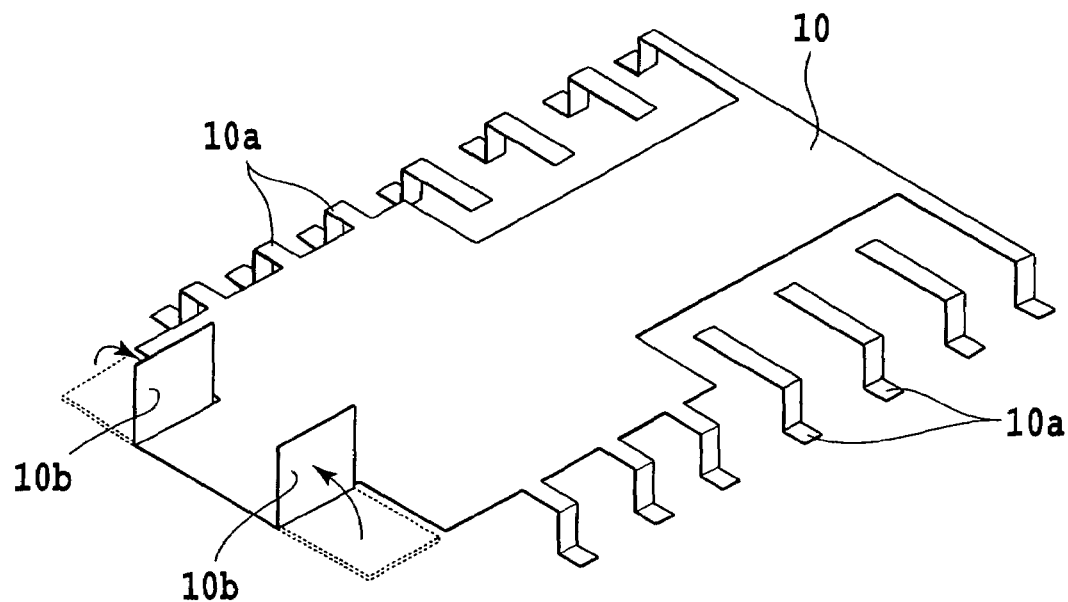
FIG. 4 is a perspective view of the lead frame.
Figure 5:
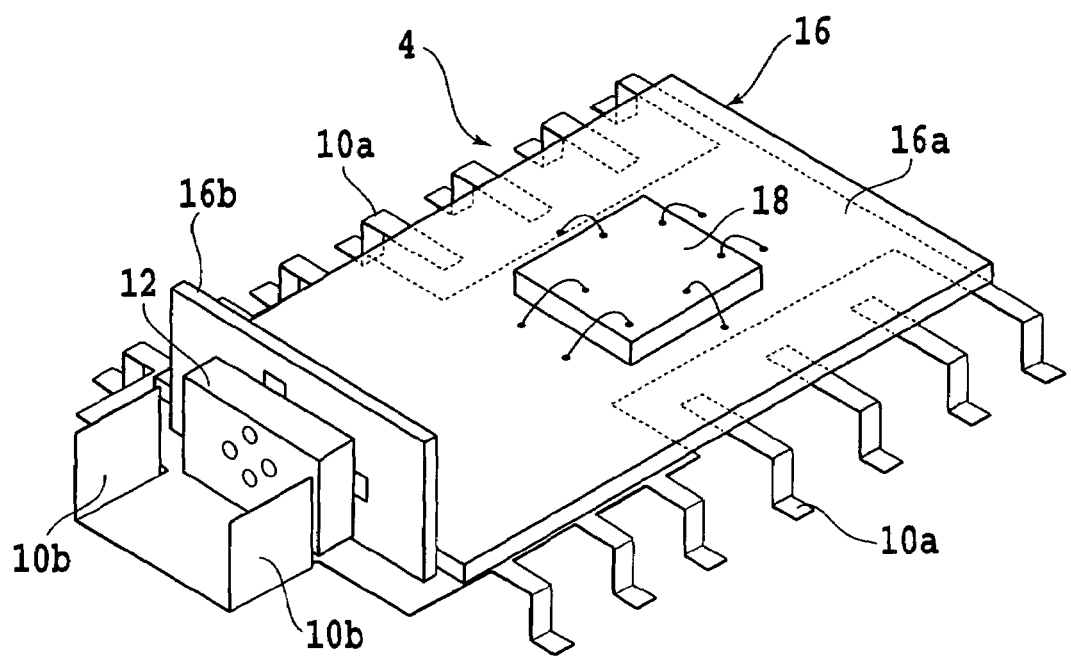
FIG. 5 is a perspective view showing a condition that a printed wiring board is mounted on the lead frame.
Figure 6A:
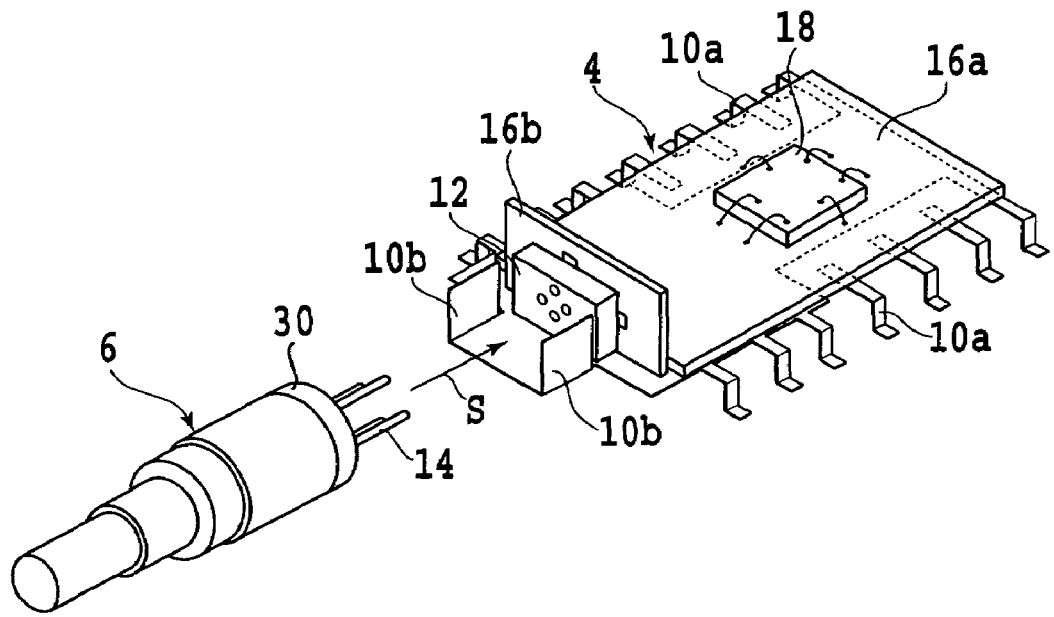
FIG. 6A is an exploded perspective view showing a manner of mounting an LD module to the electric circuit assembly.
Figure 6B:
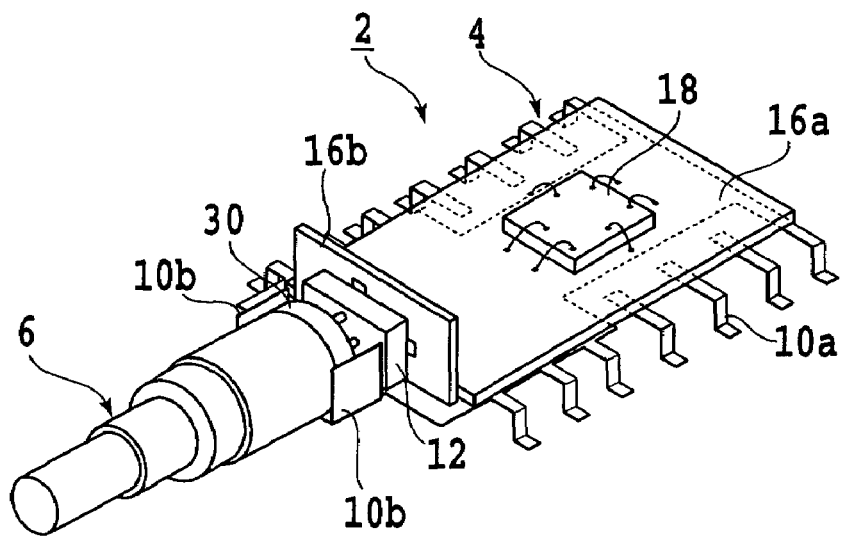
FIG. 6B is a perspective view showing a condition that the LD module is mounted to the electric circuit assembly.

Referring to FIG. 4, there is shown a perspective view of the lead frame 10. The lead frame 10 has a plurality of lead terminals 10a and a pair of ground connecting portions 10b formed by upright bending a part of the lead frame 10. As shown in FIG. 5, the first segment 16a of the printed wiring board 16 is mounted on the lead frame 10, and the SMD type socket 12 is mounted on the second surface of the second segment 16b. As shown in FIG. 6A, the LD module 6 is plug-in connected to the socket 12 in the direction shown by an arrow S. FIG. 6B shows a condition where the LD module 6 is plug-in connected with the socket 12. As shown in FIG. 6B, the ground connecting portions 10b of the lead frame 10 are in contact with a metal stem 30 of the LD module 6, thereby allowing enhancement of electromagnetic shielding of the LD module 6.

Figure 7:
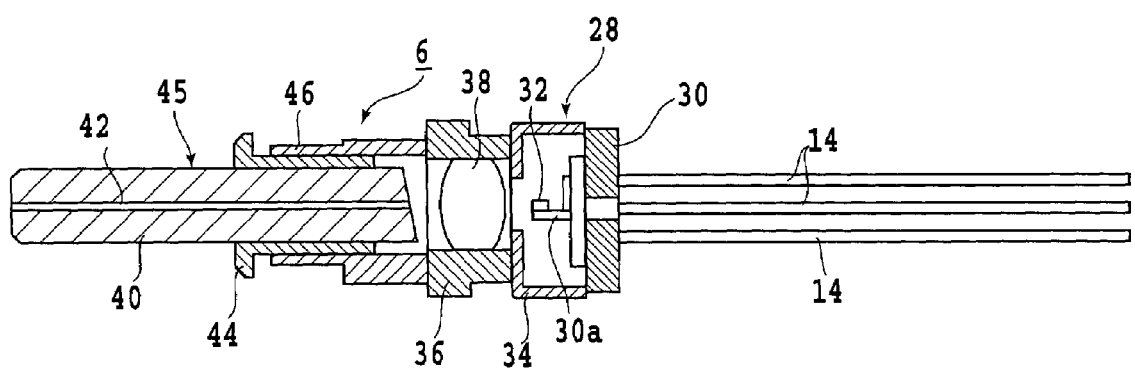
FIG. 7 is a longitudinal sectional view of the LD module.

Referring to FIG. 7, there is shown a sectional view of the LD module 6. Reference numeral 28 denotes an LD package, which includes the metal stem 30, an LD chip 32 mounted on a projecting portion 30a of the metal stem 30, and a package holder 34. A lens 38 is press-fitted in a lens holder 36. The LD package 28 and the lens 38 are aligned, and the lens holder 36 is thereafter welded to the package holder 34. Reference numeral 45 denotes a ferrule assembly, which includes a ferrule 40 having a center hole, an optical fiber 42 inserted and fixed in the center hole of the ferrule 40, and a cylindrical fitting 44 in which the ferrule 40 is press-fitted. The ferrule assembly 45 is inserted in a sleeve 46, and the LD package 28 and the ferrule 40 are aligned. Thereafter, the sleeve 46 is laser-welded to the lens holder 36 and the cylindrical fitting 44.

Figure 8:
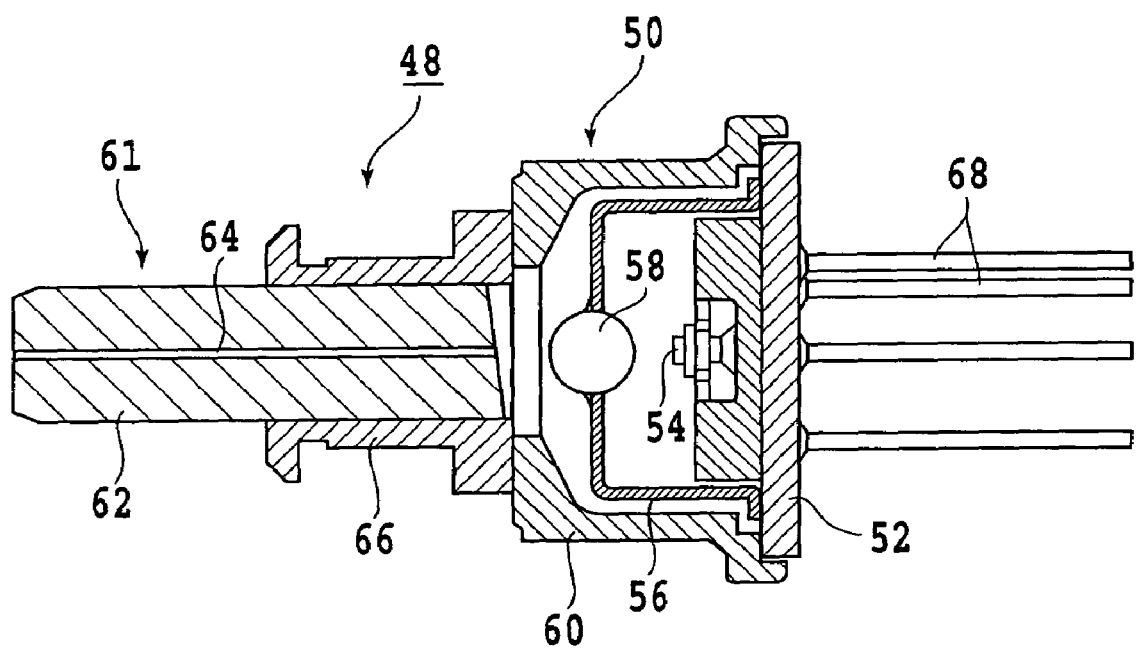
FIG. 8 is a longitudinal sectional view of a PD module.

While the LD module 6 is adopted as an optical module mounted to the electric circuit assembly 4 to configure the receptacle type optical transmitter module 2 in this preferred embodiment, a photodiode module (PD module) 48 as shown in FIG. 8 may be adopted as the optical module to configure a receptacle type optical receiver module. In this case, the second electric circuit component mounted on the second segment 16b of the printed wiring board 16 includes a preamplifier LSI as an amplifier for amplifying an electrical signal converted by the PD module 48, and SMDs such as a resistor, a capacitor, and a CDR (clock and data recovery) for recovering a clock and data.

The structure of the PD module 48 will now be described with reference to FIG. 8. Reference numeral 50 denotes a PD package, which includes a metal stem 52 having first and second surfaces opposite to each other, a plurality of leads 68 projecting from the first surface of the metal stem 52, a PD chip 54 mounted on the second surface of the metal stem 52, a cap 56 having a lens 58, and a package holder 60 fixed to the stem 52 so as to hold the PD chip 54 and the cap 56. Reference numeral 61 denotes a ferrule assembly, which includes a ferrule 62 having a center hole, an optical fiber 64 inserted and fixed in the center hole of the ferrule 62, and a cylindrical fitting 66 in which the ferrule 62 is press-fitted. The ferrule 62 and the PD package 50 are aligned so that incident light into the optical fiber 64 is coupled to the PD chip 54, and the cylindrical fitting 66 is thereafter welded to the package holder 60.

Figure 9A:
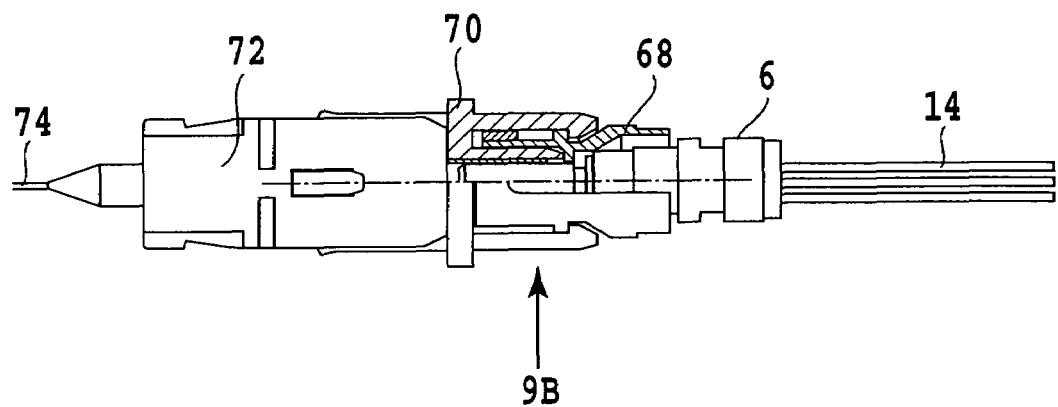
FIG. 9A is a partially sectional, elevational view showing a condition that the LD module and an optical connector are connected.
Figure 9B:
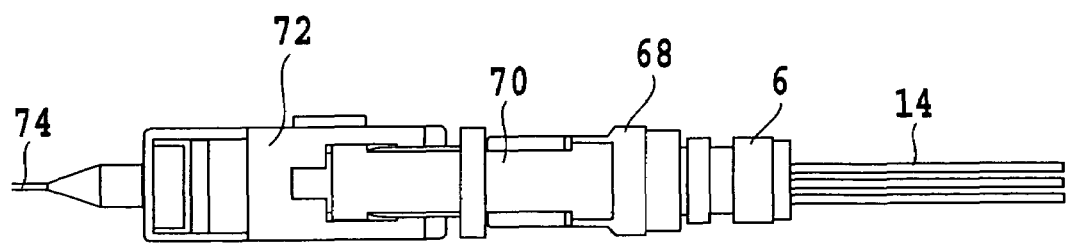
FIG. 9B is a view taken in the direction shown by an arrow 9B in FIG. 9A.

Referring to FIG. 9A, there is shown a partially sectional, elevational view of an SC type optical connector 72 to which the LD module 6 is connected. FIG. 9B is a view taken in the direction shown by an arrow 9B in FIG. 9A. The LD module 6 is connected to the optical connector 72 by inserting the LD module 6 into a frame member 68 and next connecting the frame member 68 to the optical connector 72 by means of a hook member 70. Accordingly, signal light emitted from the LD chip 32 of the LD module 6 is coupled through the optical connector 72 to an optical fiber 74. In mounting the LD module 6 to the electric circuit assembly 4, it should be noted that the LD module 6 is to be fitted to the socket 12 after cutting each lead 14 of the LD module 6 into a predetermined length.

Figure 10A:
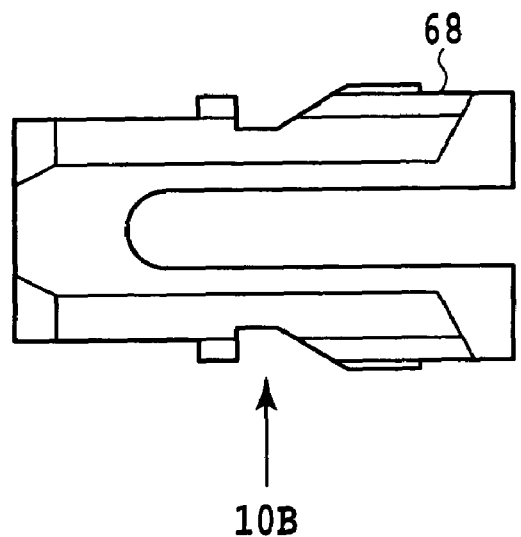
FIG. 10A is an elevational view of a frame member.
Figure 10B:
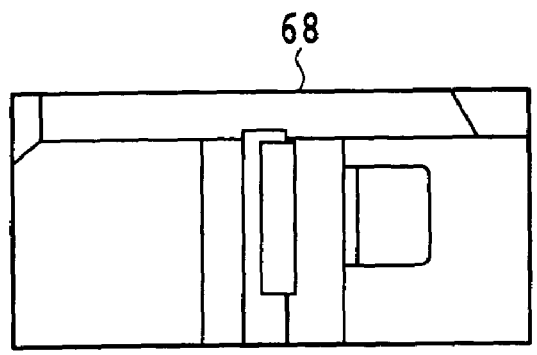
FIG. 10B is a view taken in the direction shown by an arrow 10B in FIG. 10A.
Figure 11A:
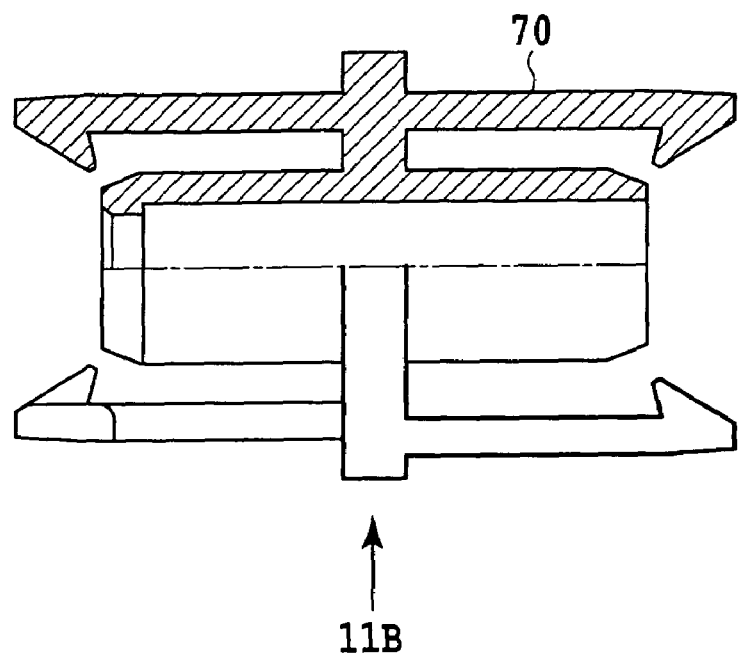
FIG. 11A is a partially sectional, elevational view of a hook member.
Figure 11B:
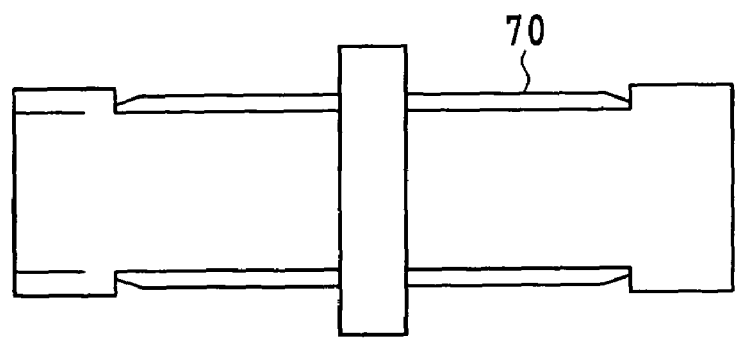
FIG. 11B is a view taken in the direction shown by an arrow 11B in FIG. 11A.

FIG. 10A is an elevational view of the frame member 68, and FIG. 10B is a view taken in the direction shown by an arrow 10B in FIG. 10A. FIG. 11A is a partially sectional, elevational view of the hook member 70, and FIG. 11B is a view taken in the direction shown by an arrow 11B in FIG.

11A. While the LD module 6 is connected to the SC type optical connector 72 by using the frame member 68 and the hook member 70 in this preferred embodiment, the receptacle type opto-electrical module according to the present invention can be connected to any types of optical connectors by suitably designing the frame member 68 and the hook member 70 so as to correspond to the shapes of any optical connectors other than the SC type optical connector 72.

Figure 12:
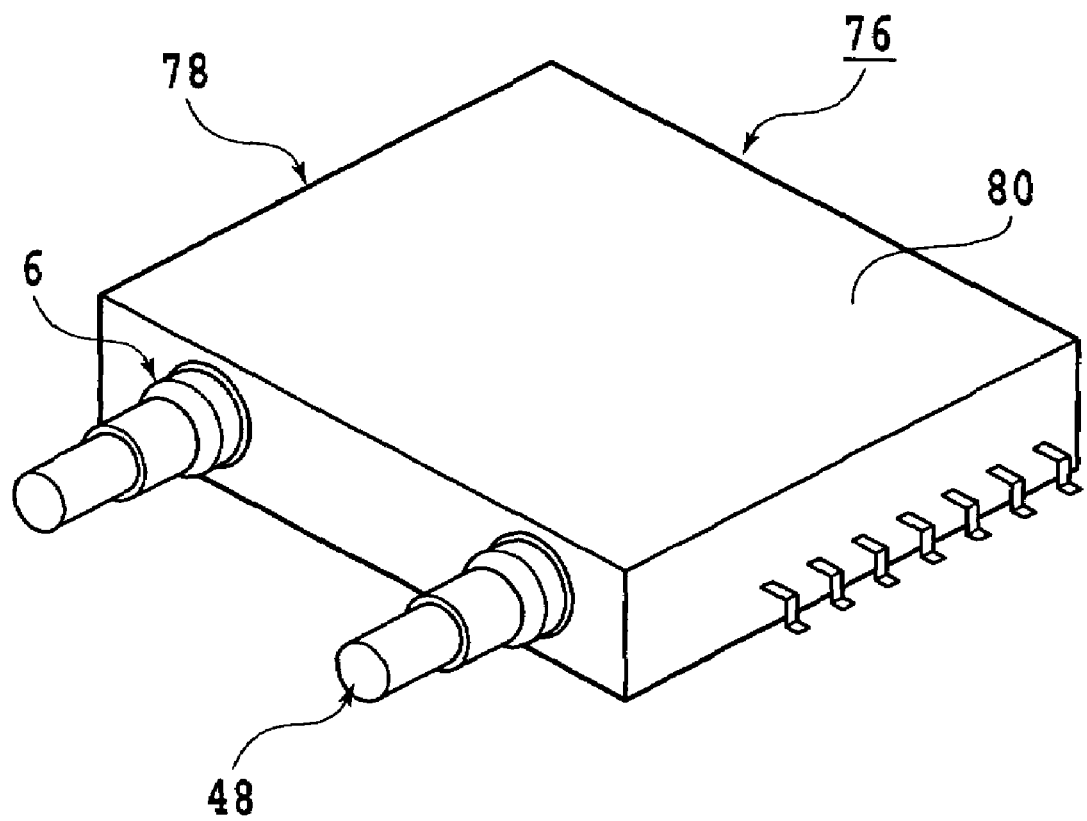
FIG. 12 is a perspective view of a second preferred embodiment of the present invention.

Referring to FIG. 12, there is shown a perspective view of a receptacle type optical transmitter and receiver module (transceiver module) according to a second preferred embodiment of the present invention. The receptacle type optical transceiver module according to this preferred embodiment is configured by mounting both the LD module 6 and the PD module 48 to an electric circuit assembly 78 similar to the electric circuit assembly 4 in the first preferred embodiment. Although not particularly shown, the electric circuit assembly 78 includes two SMD type sockets for respectively receiving the LD module 6 and the PD module 48. The electric circuit assembly 78 further includes a mold resin 80 for sealing. Thus, the electric circuit assembly 78 has transmitting and receiving functions, and the LD module 6 for transmission and the PD module 48 for reception are mounted to the respective sockets of the electric circuit assembly 78, thereby obtaining the receptacle type optical transceiver module 76.

Figure 13:
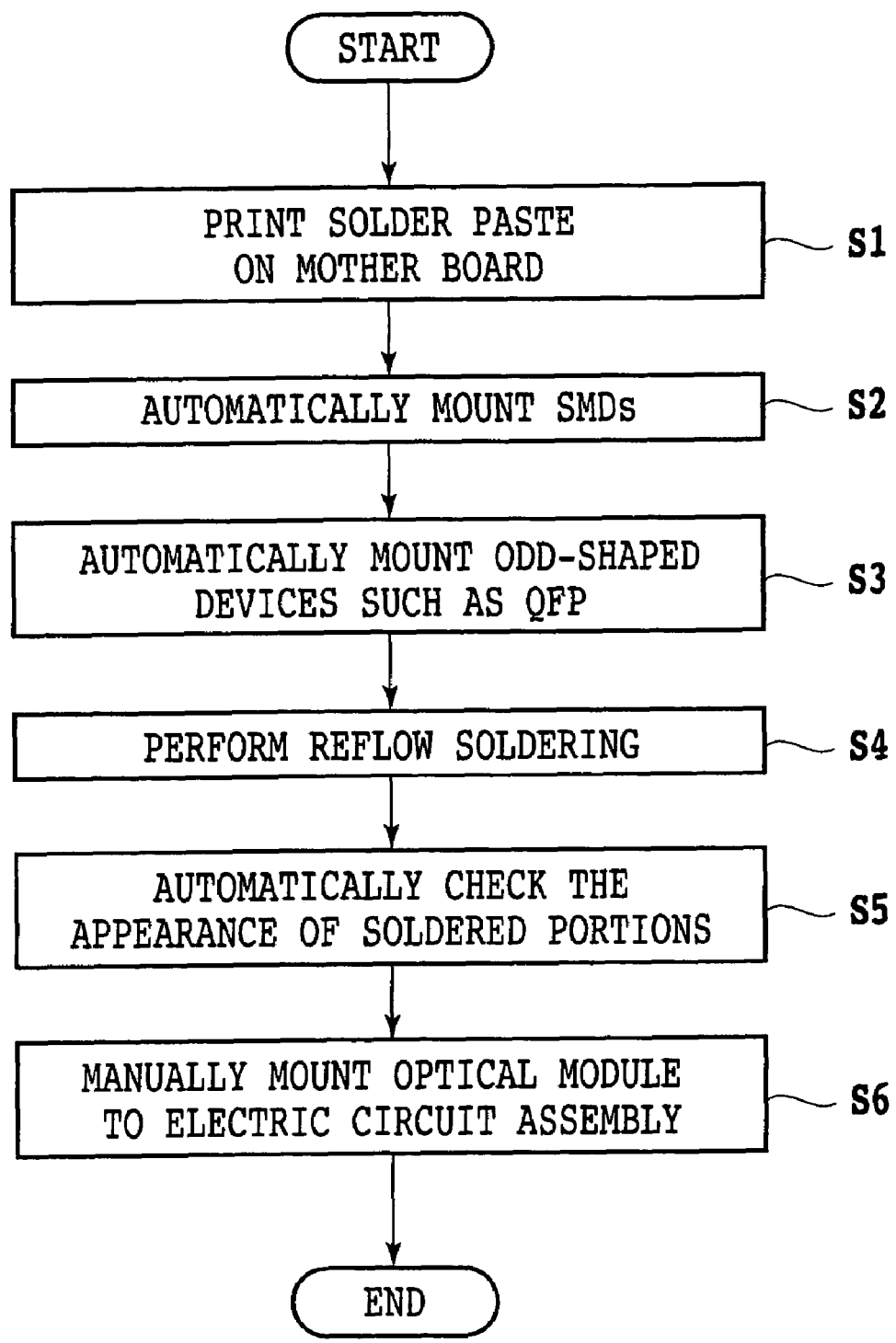
FIG. 13 is a flowchart showing a process of mounting the opto-electrical module of the present invention on a mother board.

A production flow in mounting the receptacle type optical transmitter or receiver module according to the present invention on a mother board will now be described with reference to FIG. 13. In step S1, a solder paste is printed on the mother board. In step S2, SMDs such as chip devices are automatically mounted. In step S3, odd-shaped devices such as quad flat packages (QFP) are automatically mounted.

In step S4, reflow soldering is performed. Thereafter, automated appearance check for soldered portions is performed (step S5), thereby mounting the electric circuit assembly 4 on the mother board. Thereafter, the optical module 6 or 48 is manually mounted to the electric circuit assembly 4 (step S6), thus mounting the receptacle type optical transmitter or receiver module on the mother board.

Figure 14A:
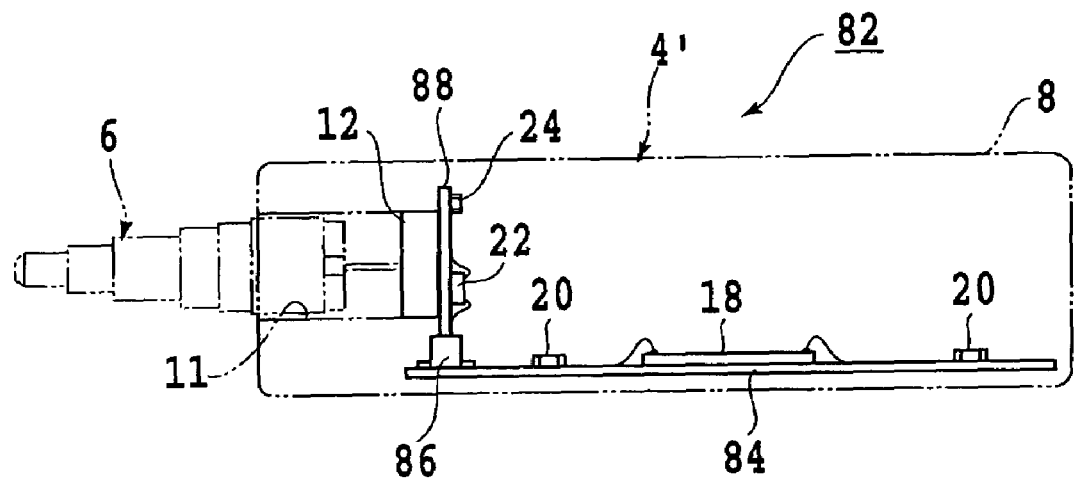
FIG. 14A is an elevational view showing an internal configuration of an electric circuit assembly in a third preferred embodiment of the present invention.
Figure 14B:
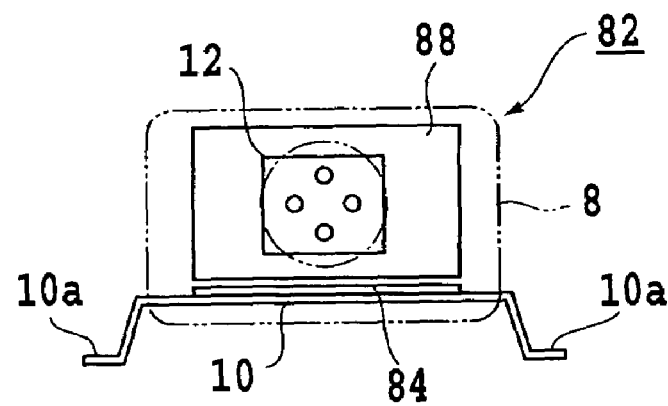
FIG. 14B is a left side view of FIG. 14A in the condition where the lead frame is added.
Figure 15:
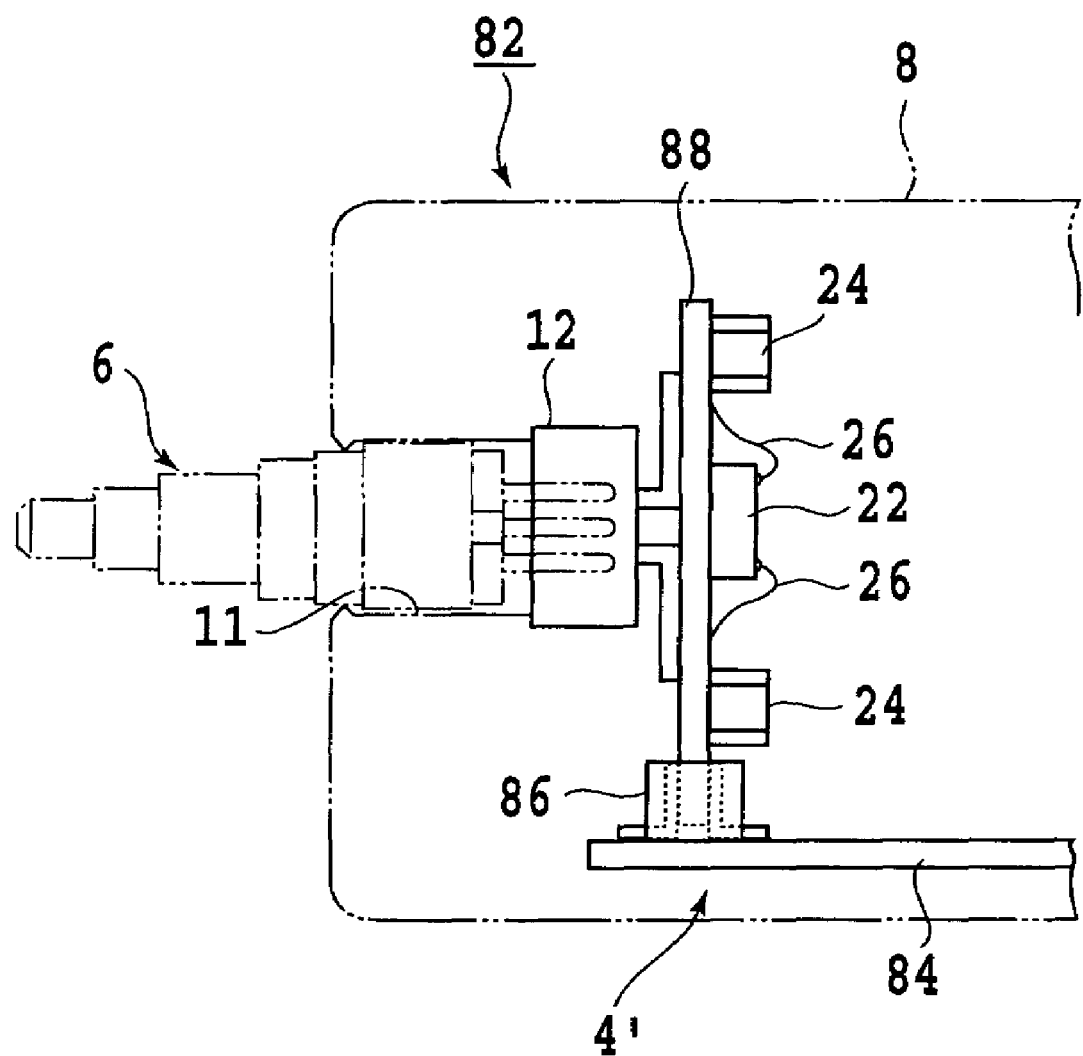
FIG. 15 is a partially cutaway, enlarged view of FIG. 14A.

A receptacle type optical transmitter module 82 according to a third preferred embodiment of the present invention will now be described with reference to FIGS. 14A, 14B, and 15. FIG. 14A is an elevational view showing an internal structure of an electric circuit assembly 4', and FIG. 14B is a left side view of FIG. 14A. In FIG. 14B, however, the lead frame 10 is additionally shown. FIG. 15 is a partially cutaway, enlarged view of the electric circuit assembly 4'. The receptacle type optical transmitter module 82 includes a first printed wiring board 84, an SMD type socket 86 mounted on the first printed wiring board 84, and a second printed wiring board 88 detachably mounted to the socket 86.

A conductor pattern formed on the upper surface of the first printed wiring board 84 is partially exposed at a portion for mounting the socket 86, and this exposed conductor pattern is plated with gold. The second printed wiring board 86 is plug-in connected to the socket 86, thereby obtaining electrical connection to the first printed wiring board 84. The other configuration of this preferred embodiment is similar to that of the first preferred embodiment shown in FIGS. 2A, 2B, and 3, and the same parts are denoted by the same reference numerals, so the description thereof will be omitted herein.

The present invention can exhibit the following effects.

(1) It is possible to provide a receptacle type optical transmitter and/or receiver module wherein the optical module can be simply removed from the electric circuit assembly.

(2) A commercially available coaxial optical component not requiring heat resistance can be used, so that the cost of a receptacle type optical transmitter and/or receiver module can be reduced.

(3) The optical module and the electric circuit assembly can be separately handled, so that the electric circuit assembly can be fabricated by automatically mounting electric circuit components on a printed wiring board and next performing simultaneous reflow soldering. Further, only the optical module or the electrical circuit assembly that has malfunctioned can be replaced.

(4) By designing the circuit configuration of the electric circuit assembly to a circuit configuration covering a low-speed region to a high-speed region and exchanging only the optical module, the electric circuit assembly can be used commonly.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A receptacle type optical transmitter and/or receiver module comprising:
    a printed wiring board having a first non-flexible segment, a second non-flexible segment, and a flexible portion for connecting said first segment and said second segment;
    a first electric circuit component mounted on said first segment;
    a second electric circuit component mounted on said second segment;
    a socket mounted on said second segment; and
    an optical module detachably mounted to said sockets
    wherein said second segment is arranged substantially perpendicularly to said first segment and has first and second surfaces opposite to each other; and
    said second electric circuit component is mounted on said first surface of said second segment, and said socket is mounted on said second surface of said second segment.

2. A receptacle type optical transmitter and/or receiver module according to claim 1, further comprising a lead frame on which said first segment of said printed wiring board is mounted.

3. A receptacle type optical transmitter and/or receiver module according to claim 2, further comprising a resin for sealing said printed wiring board, a part of said lead frame, and said socket except a portion for receiving said optical module.

4. A receptacle type optical transmitter and/or receiver module according to claim 2, wherein said optical module has a metal stem, and said metal stem is in contact with said lead frame.

5. A receptacle type optical transmitter and/or receiver module according to claim 1, wherein said optical module comprises a LD module, and said second electric circuit component comprises a driver IC for driving said LD module.

6. A receptacle type optical transmitter and/or receiver module according to claim 1, wherein said optical module comprises a PD module, and said second electric circuit component comprises any one of a preamplifier and a CDR.

7. A receptacle type optical transmitter and/or receiver module according to claim 1, wherein:
   said socket includes a first socket and a second socket; and
   said optical module includes an LD module detachably mounted to said first socket and a PD module detachably mounted to said second socket.

8. A receptacle type optical transmitter and/or receiver module comprising:
   a first non-flexible printed wiring board;
   a second non-flexible printed wiring board arranged substantially perpendicular at a predetermined angle with respect to said first printed wiring board;
   a flexible printed wiring board for connecting said first printed wiring board and said second printed wiring board;
   a first electric circuit component mounted on said first printed wiring board;
   a second electric circuit component mounted on said second printed wiring board;
   a socket mounted on said second printed wiring board; and
   an optical module detachably mounted to said socket,
   wherein said second printed wiring board has first and second surfaces opposite to each and
   said second electric circuit component is mounted on said first surface of said second printed writing board, and said socket is mounted on said second surface of said second printing wiring board.

9. A receptacle type optical transmitter and/or receiver module according to claim 8, further comprising a lead frame on which said first printed wiring board is mounted.

10. A receptacle type optical transmitter and/or receiver module according to claim 9, further comprising a resin for sealing said first and second printed wiring boards, said flexible printed wiring board, a part of said lead frame, and said socket except a portion for receiving said optical module.

11. A receptacle type optical transmitter and/or receiver module according to claim 9, wherein said optical module has a metal stem, and said metal stem is in contact with said lead frame.

12. A receptacle type optical transmitter and/or receiver module according to claim 8, wherein said optical module comprises a LD module, and said second electric circuit component comprises a driver IC for driving said LD module.

13. A receptacle type optical transmitter and/or receiver module according to claim 8, wherein said optical module comprises a PD module, and said second electric circuit component comprises any one of a preamplifier and a CDR.

14. A receptacle type optical transmitter and/or receiver module according to claim 8, wherein:
   said socket includes a first socket and a second socket; and
   said optical module includes an LD module detachably mounted to said first socket and a PD module detachably mounted to said second socket.

15. A receptacle type optical transmitter and/or receiver module comprising:
   a first non-flexible printed wiring board;
   a first socket mounted on said first printed wiring board;
   a second non-flexible printed wiring board detachably mounted to said first socket so that said second printing wiring board is substantially perpendicular to said first printing wiring board
   a first electric circuit component mounted on said first printed wiring board;
   a second electric circuit component mounted on said second printed wiring board;
   a second socket mounted on said second printed wiring board; and
   an optical module detachably mounted to said second socket,
   wherein said second printing wiring board has first and second surfaces opposite to each and
   said second electric circuit component is mounted on said first surface of said second printing wiring board, and said socket is mounted on said second surface of said second printing wiring board.

* * * * *

UNITED STATES PATENT AND TRADEMARK OFFICE
CERTIFICATE OF CORRECTION

PATENT NO. : 7,004,646 B2
APPLICATION NO. : 10/688967
DATED : February 28, 2006
INVENTOR(S) : Yasuhiro Ichihara et al.

Page 1 of 1

It is certified that error appears in the above-identified patent and that said Letters Patent is hereby corrected as shown below:

Column 8, line 39, change "sockets" to --socket,--

Column 9, line 26, after "each" insert --other--

Column 10, line 23, after "board" insert --;--

Column 10, line 33, after "each" insert --other--

Signed and Sealed this

Third Day of October, 2006

JON W. DUDAS
*Director of the United States Patent and Trademark Office*